US006737216B2

(12) United States Patent
Kannurpatti et al.

(10) Patent No.: US 6,737,216 B2
(45) Date of Patent: May 18, 2004

(54) LASER ENGRAVABLE FLEXOGRAPHIC PRINTING ELEMENT AND A METHOD FOR FORMING A PRINTING PLATE FROM THE ELEMENT

(75) Inventors: Anandkumar Ramakrishnan Kannurpatti, East Windsor, NJ (US); Howard Ensign Simmons, III, Wilmington, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/994,134

(22) Filed: Nov. 26, 2001

(65) Prior Publication Data

US 2002/0123003 A1 Sep. 5, 2002

Related U.S. Application Data

(60) Provisional application No. 60/254,163, filed on Dec. 8, 2000.

(51) Int. Cl.$^7$ ................................................. G03F 7/00
(52) U.S. Cl. .............................. 430/270.1; 430/281.1; 430/306; 430/944; 430/945; 430/913; 430/915
(58) Field of Search ................. 430/306, 944, 430/945, 270.1, 913, 915

(56) References Cited

U.S. PATENT DOCUMENTS

| 3,549,733 | A | | 12/1970 | Caddell | |
|---|---|---|---|---|---|
| 4,292,152 | A | | 9/1981 | Lechtken et al. | |
| 4,430,417 | A | * | 2/1984 | Heinz et al. | 430/286.1 |
| 4,447,520 | A | | 5/1984 | Henne et al. | |
| 4,719,297 | A | | 1/1988 | Henne et al. | |
| 4,868,091 | A | | 9/1989 | Boettcher et al. | |
| 5,177,171 | A | * | 1/1993 | Usubuchi et al. | 528/83 |
| 5,259,311 | A | * | 11/1993 | McCaughey, Jr. | 101/401.1 |
| 5,262,275 | A | * | 11/1993 | Fan | 430/273.1 |
| 5,585,415 | A | * | 12/1996 | Gorzalski et al. | 522/18 |
| 5,705,310 | A | * | 1/1998 | Van Zoeren | 430/201 |
| 5,767,169 | A | | 6/1998 | Leppard et al. | |
| 5,798,202 | A | * | 8/1998 | Cushner et al. | 430/306 |
| 5,804,353 | A | * | 9/1998 | Cushner et al. | 430/306 |
| 5,925,490 | A | | 7/1999 | Loerzer et al. | |
| 5,994,026 | A | * | 11/1999 | DeBoer et al. | 430/270.1 |
| 6,159,659 | A | * | 12/2000 | Gelbart | 430/306 |
| 6,190,832 | B1 | * | 2/2001 | Goffing et al. | 430/273.1 |
| 6,207,344 | B1 | * | 3/2001 | Ramlow et al. | 430/270.1 |

FOREIGN PATENT DOCUMENTS

| GB | 2071011 A | 9/1981 |
|---|---|---|
| GB | 2071574 A | 9/1981 |

OTHER PUBLICATIONS

U.S. patent application Ser. No. 09/619,052, Cheng et al., filed Jul. 18, 2000.
Kern, W. et al., Laser Engraving of Rubbers, The Influence of Fillers on the Engraving Process, KGK Kautschuk Gummi Kunststoffe 50, Jahrgang, Nr. Oct. 1997, 710–715.
Disclosed Anonymously, Novel applications for acylphosphine–oxides, Research Disclosure 35077, Jun. 1993, 415–416.

* cited by examiner

*Primary Examiner*—Mark F. Huff
*Assistant Examiner*—Amanda C. Walke
(74) *Attorney, Agent, or Firm*—Thomas H. Magee

(57) ABSTRACT

Flexographic printing plate is made from a laser engravable flexographic printing element which includes on a support at least one laser engravable reinforced elastomeric layer of an elastomeric composition comprising an elastomeric binder, at least one monomer, a photoinitiator system that decreases in ultraviolet absorbance as polymerization proceeds and at least one additive which absorbs infrared radiation at 9 to 12 micrometers.

10 Claims, No Drawings

LASER ENGRAVABLE FLEXOGRAPHIC PRINTING ELEMENT AND A METHOD FOR FORMING A PRINTING PLATE FROM THE ELEMENT

BACKGROUND OF THE INVENTION

1. Field of the Invention

This invention pertains to a flexographic printing element and a method for engraving the printing element by laser radiation to form a relief so that the element is useful as a flexographic printing plate.

2. Description of Related Art

Printing plates are well known for use in flexographic printing, particularly on surfaces which are corrugated or smooth, such as packaging materials, e.g., cardboard, plastic films, etc. One type of flexographic printing plate is made from vulcanized rubber. Commercial rubbers can be natural or synthetic, such as ethylenepropylenediene monomer (EPDM) elastomers.

Lasers can develop sufficient power densities to ablate certain materials. Lasers such as high-power carbon dioxide lasers can ablate many materials such as wood, plastic and rubber and even metals and ceramics. Once the output from a laser is focused at a particular point on a substrate with a suitable power density, it is possible to remove material in depth to create a relief. Areas not struck by the laser beam are not removed. Thus, the use of the laser offers the potential of producing very intricate engravings in the proper material.

Recently, it has been possible to laser engrave a rubber element directly to provide the desired relief surface necessary for flexographic printing. Laser engraving has provided a wide variety of opportunities for rubber printing plates. Highly concentrated and controllable energy lasers can engrave very fine details in rubber. The relief of the printing plate can be varied in many ways. Very steep as well as gently decreasing relief slopes can be engraved so as to influence the dot gain of such plates. EPDM rubber can be laser engraved to form flexographic printing plates.

U.S. Pat. No. 3,459,733 issued to Caddell describes a method for producing polymer printing plates. The printing plate is made by exposing a layer of the polymeric material to a controlled laser beam of sufficient intensity to ablate the polymer and form depressions on the surface.

U.S. Pat. No. 5,798,202 and U.S. Pat. No. 5,804,353 disclose processes for making a flexographic printing plate by laser engraving a reinforced elastomeric layer on a flexible support. The process disclosed in U.S. Pat. No. 5,798,202 involves reinforcing and laser engraving a single-layer flexographic printing element comprised of a reinforced elastomeric layer on a flexible support. The elastomeric layer is reinforced mechanically, or thermochemically, or photochemically or combinations thereof. Mechanical reinforcement is provided by incorporating reinforcing agents, such as finely divided particulate material, into the elastomeric layer. Photochemical reinforcement is accomplished by incorporating photohardenable materials into the elastomeric layer and exposing the layer to actinic radiation. Photohardenable materials include photocrosslinkable and photopolymerizable systems having a photoinitiator or photoinitiator system.

The process disclosed in U.S. Pat. No. 5,804,353 is similar to U.S. Pat. No. 5,798,202 except that the process involves reinforcing and laser engraving a multilayer flexographic printing element comprised of a reinforced elastomeric top layer, and an intermediate elastomeric layer on a flexible support. The elastomeric layer is reinforced mechanically, or thermochemically, or photochemically or combinations thereof. Mechanical and photochemical reinforcement is accomplished in the same manner as described by U.S. Pat. No. 5,798,202. The intermediate elastomeric layer may be reinforced as well.

A problem associated with the elastomeric elements which are reinforced both mechanically and photochemically is that laser engraving does not efficiently remove the elastomeric material to provide desired relief quality, and ultimately printing quality. It is desirable to use an additive in the elastomeric layer which is sensitive to infrared light in order to enhance the engraving efficiency of the element. Photochemically reinforcing the element provides the desired properties for engraving as well as in its end-use as a printing plate. However, the presence of the additive as particulate or other absorbing material tends to reduce the penetration of the ultraviolet radiation required to photochemically reinforce the element. If the elastomeric layer is insufficiently cured during photochemical reinforcement, the laser radiation cannot effectively remove the material and poor relief quality of the engraved area results. Further, the debris resulting from laser engraving tends to be tacky and is difficult to completely remove from the element. Additionally, if the element is not sufficiently photochemically reinforced the required end-use properties as a printing plate are not achieved. These problems tend to be exacerbated with increasing concentration of the additive that enhances engraving efficacy.

SUMMARY OF THE INVENTION

It is an object of the present invention to overcome the disadvantages of the prior art and to provide an elastomeric element which can be laser engraved to form a relief surface suitable for use as a flexographic printing plate.

In accordance with this invention there is provided a laser-engravable flexographic printing element comprising a support; and at least one laser engravable reinforced elastomeric layer of an elastomeric composition comprising an elastomeric binder, at least one monomer, a photoinitiator system that decreases in UV absorbance as polymerization proceeds, and at least one additive containing Si—O functionality or P—O functionality which absorbs infrared radiation, preferably at 9 to 12 micrometers.

In accordance with another aspect of this invention there is provided a method for forming a flexographic printing plate from the above flexographic printing element comprising reinforcing the elastomeric layer of the elastomeric composition by blanket exposure to ultraviolet radiation and exposing the reinforced element imagewise with infrared laser radiation at 9 to 12 micrometers to engrave the elastomeric layer.

DESCRIPTION OF THE PREFERRED EMBODIMENT(S)

The term "laser engravable" as used herein refers to materials capable of absorbing laser radiation such that those areas of the materials which are exposed to a laser beam of sufficient intensity become physically detached with sufficient resolution and relief depth to be suitable for flexographic applications. By "physically detached", it is meant that the material so exposed is either removed or is capable of being removed by any mechanical means such as by vacuum cleaning or washing or by directing a stream of gas across the surface to remove the loosened particles.

The present invention involves a flexographic printing element which includes on a support at least one reinforced elastomeric layer of an elastomeric composition comprising an elastomeric binder, at least one monomer, a photoinitiator system that decreases in ultraviolet (UV) absorbance as polymerization proceeds, and an additive sensitive to infrared radiation. The flexographic printing element is engravable with laser radiation to physically detach the reinforced elastomeric layer and form relief depth in the areas irradiated with the laser. The elastomeric layer formed from the elastomeric composition is reinforced both by photochemical means in that the composition is photosensitive and hardens upon exposure to actinic radiation and by mechanical means in that the composition includes at least one additive.

Suitable elastomeric binders should be chosen so that the resulting element can be laser engraved as discussed below. In addition, the resulting plate should have the characteristics associated with flexographic printing. These characteristics include flexibility, resilience, Shore A hardness, ink compatibility, ozone resistance, durability and resolution. It is also preferred, but not essential, that such materials do not incorporate halogens or heteroatoms such as sulfur so as to avoid any toxic gases being emitted during the laser engraving process. Thus, either a single elastomeric material or a combination of materials can be used so long as the characteristics desired for flexography are obtained. The binder is present from 40 to 75%, and preferably at least 45% to 55%, by weight of the elastomeric composition.

Examples of elastomeric materials are described in Plastic Technology Handbook, Chandler et al., Ed., (1987). In many cases it maybe desirable to use thermoplastic elastomeric materials to formulate the elastomeric layer. When a thermoplastic elastomeric layer is reinforced photochemically, the layer remains elastomeric but is no longer thermoplastic after such reinforcement. This includes, but is not limited to, elastomeric materials such as copolymers of butadiene and styrene, copolymers of isoprene and styrene, styrene-diene-styrene triblock copolymers, etc. as described in U.S. Pat. Nos. 4,323,636, 4,430,417, and 4,045,231. These triblock copolymers can be divided into three basic types of polymers: polystyrene-polybutadiene-polystyrene (SBS); polystyrene-isoprene-polystyrene (SIS); or polystyrene-poly(ethylenebutylene)-polystyrene (SEBS).

In addition to the elastomeric binder, a second binder may optionally be present in the elastomeric layer. A suitable second binder includes non-crosslinked polybutadiene and polyisoprene; nitrile elastomers; polyisobutylene and other butyl elastomers; polyalkyleneoxides; polyphosphazenes; elastomeric polymers and copolymers of acrylates and methacrylate; elastomeric polyurethanes and polyesters; elastomeric polymers and copolymers of olefins such as ethylene-propylene copolymers and non-crosslinked EPDM; elastomeric copolymers of vinyl acetate and its partially hydrogenated derivatives. The term elastomers, as used herein, also encompasses core-shell microgels and blends of microgels and preformed macromolecular polymers.

The elastomeric composition may also be considered a photopolymerizable composition since the elastomeric composition is photosensitive and reinforced, that is, hardened by polymerization induced by exposure to radiation, preferably ultraviolet radiation. As used herein, the term "photopolymerizable" is intended to encompass systems which are photopolymerizable, photocrosslinkable, or both. The elastomeric or photopolymerizable composition includes an elastomeric binder, at least one monomer, and an initiator having sensitivity to actinic radiation. In most cases, the initiator will be sensitive to visible or ultraviolet radiation. Any photopolymerizable compositions which are suitable for the formation of flexographic printing plates can be used for the present invention. Examples of suitable compositions have been disclosed, for example, in Chen et al., U.S. Pat. No. 4,323,637; Grütetzmacher et al., U.S. Pat. No. 4,427,749; Feinberg et al., U.S. Pat. No. 4,894,315; and Martens U.S. Pat. No. 5,015,556.

The elastomeric composition (as well as the photopolymerizable composition) contains a single monomer or mixture of monomers which must be compatible with the binder to the extent that a clear, non-cloudy photosensitive layer is produced. Monomers that can be used in the elastomeric composition are well known in the art and include but are not limited to addition-polymerization ethylenically unsaturated compounds having relatively low molecular weights (generally less than about 30,000). Preferably, the monomers have a relatively low molecular weight less than about 5000. Examples of suitable monomers include, but are not limited to, t-butyl acrylate, lauryl acrylate, the acrylate and methacrylate mono- and poly-esters of alcohols and polyols such as alkanols; alkylene glycols; trimethylol propane; ethoxylated trimethylol propane; pentaerythritol; dipentaerylitol; and the like. Other examples of suitable monomers include acrylate and methacrylate derivatives of isocyanates, esters, epoxides and the like. Further examples of monomers can be found in Chen U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315. The monomer is present in at least an amount of 5%, preferably 10%, by weight of the elastomeric composition.

The elastomeric composition includes a photoinitiator which decreases absorbance of ultraviolet (UV) radiation as polymerization proceeds. Photoinitiators which decrease absorbance of UV radiation as polymerization proceeds are known as bleachable photoinitiators which allow UV radiation to continue to expose the photopolymerizable material as crosslinking occurs. Bleachable photoinitiators are different from conventional photoinitators for photopolymerizable materials since conventional initiators continue to absorb actinic radiation after exposure has begun. However, once bleachable photoinitiators react in the elastomeric composition, the initiator no longer has the capacity to absorb radiation. That is, bleachable photoinitiators allow UV radiation to penetrate deeper into the layer as polymerization proceeds so that the layer cures more rapidly and completely than photopolymerizable layers with conventional initiators given the same exposure. Also bleachable photoinitiators will provide greater crosslinking density within the reinforced elastomeric layer which will improve the engravability, hardness, durability and ink resistance of the printing plate. When an additive is present in the layer of elastomeric composition, the use of bleachable photoinitiators is particularly useful since the additive tends to decrease the crosslinking efficiency of the layer because of absorption or scattering of actinic radiation. Further, other components or ingredients in the elastomeric layer may also absorb or scatter actinic radiation as well, tending to decrease crosslinking efficiency of the layer. Thus, bleachable photoinitiators provide greater depth of cure in the elastomeric layer. The bleachable photoinitiator is sensitive to wavelengths of 250 nm to 500 nm, preferably about 365 nm. Bleachable photoinitiators suitable for use in the elastomeric composition of the present invention are acylphosphine oxides. Acylphosphine oxides which are alkoxyphenyl-substituted are particularly preferred and are disclosed by Leppard et al. in U.S. Pat. No. 5,767,169. Alkoxyphenyl-substituted bis acylphosphine oxides include, but are not limited to, 2,4,6-trimethyl-benzoyl-diphenylphosphine oxide, bis(2,4,6-trimethylbenzoyl)-2,4-diisobutoxyphenylphosphine oxide, bis(2,4,6-trimethylbenzoyl)-phenylphosphine oxide, bis(2,4,6-trimethylbenzoyl)-2,4-dioctyloxyphenyl phosphine oxide, bis(2,4,6-trimethylbenzoyl)-2,4-diisopropoxyphenylphosphine oxide, bis(2,4,6-trimethylbenzoyl)-2,4-dihexyloxyphenylphosphine oxide, bis(2,4,6-trimethylbenzoyl)-2,4-di-sec-butoxyphenylphosphine oxide, bis(2,4,6-trimethylbenzoyl)-2-methyl-4-methoxyphenylphosphine oxide, bis(2,4,6-trimethylbenzoyl)-2-propoxy-4-methylphenylphosphine oxide, bis(2,4,6-trimethylbenzoyl)-2,4-diisopentyloxyphenylphosphine oxide, bis(2,4,6-trimethylbenzoyl)-2,6-dimethyl-4-butoxyphenylphosphine oxide, bis(2,6-dimethyoxybenzoyl)-2,4-dioctyloxyphenylphosphine oxide, bis(2,6-dimethyoxybenzoyl)-2,4-diisobutoxyphenylphosphine oxide, bis(2,6-dimethyoxybenzoyl)-2-methyl-4-methoxyphenylphosphine oxide, and bis(2,6-diethyoxybenzoyl)-2-propoxy-4-methylphenylphosphine oxide. Most preferred bleachable photoiniators are bis(2,4,6-trimethylbenzoyl)-phenylphosphine oxide and 2,4,6-trimethyl-benzoyldiphenylphosphine oxide. The bleachable photoinitiator is present from 0.05 to 3%, preferably 0.10 to 1.0%, by weight of the elastomeric composition.

The rate of photopolymerization of a photopolymerizable layer is directly proportional to the square root of the light intensity that impinges upon it as well as the square root of the concentration of the light absorbing and radical generating species (photoinitiator). As the photoinitiator concentration is increased, the rate of polymerization increases. However, the light penetrating through a given thickness of the sample decreases and, as a result, the rate of polymerization can decrease. Therefore, there is a need to optimize the photoinitiator concentration to maximize the rate of photopolymerization (or curing rate). This optimum depends on the thickness of photopolymerizable layer as well as the absorbance characteristics of the photoinitiator. Typically, such an optimum is found by empirical studies by those skilled in the art. In the case of the bleachable photoinitiators which are included in the elastomeric composition, it also depends on the rate of bleaching of the initiator, that is, how quickly the initiator reacts, and any remnant absorbance of the products of these initiators. Further, for the elastomeric composition of the present invention, the absorbance, reflectance and scattering effects of the additive or other substances that are in the composition also need to be considered. As a result, typically, the optimum initiator concentration is found for a specific composition (e.g., additive concentration) and a specific thickness by empirical studies.

The elastomeric composition can optionally include conventional photoinitiators that can be any single compound or combination of compounds which are sensitive to actinic radiation, generating free radicals which initiate the polymerization of the monomer or monomers without excessive termination. The photoinitiator is generally sensitive to actinic light, e.g., visible or ultraviolet radiation, preferably ultraviolet radiation. Preferably, the photoinitiator should be thermally inactive at and below 185° C. Examples of suitable photoinitiators include the substituted and unsubstituted polynuclear quinones. Examples of suitable systems have been disclosed in Grüetzmacher U.S. Pat. No. 4,460,675 and Feinberg et al., U.S. Pat. No. 4,894,315. Photoinitiators are generally present in amounts from 0.001% to 10.0% based on the weight of the photopolymerizable composition.

The elastomeric composition further includes at least one additive containing silica-oxygen (Si—O bond) functionality or phosphorus-oxygen (P—O bond) functionality which absorbs infrared radiation, preferably at 9 to 12 micrometers. The engraving sensitivity of the elastomeric layer is increased by the presence of the additive which is sensitive to the wavelength of laser radiation used for engraving, which preferably is 9 and 12 micrometers. Thus, the sensitivity of at least one additive is matched to the wavelength of laser radiation used for engraving which, in the present invention, is typically a $CO_2$ laser. Increased engraving sensitivity of the elastomeric layer, results in increasing the speed of engraving (compared to elastomeric materials without additive) and reducing the tackiness of the debris generated by engraving. The additive may also enhance the mechanical properties of the elastomeric layer, such as tensile strength, stiffness, tear resistance, and abrasion resistance. Suitable additives include particulate inorganic filler materials containing silica-oxygen single bond functionality such as silicas, clays, talcs, mica, and silicates, for example, calcium silicate and zirconium silicate. Suitable additives also include organic materials containing phosphorous-oxygen single bond functionality such as aromatic phosphates, aromatic phosphites and aromatic phosphonates. Additives with the phosphorous-oxygen single bond may be in particulate, liquid, or polymeric form. Silicates, particularly zirconium silicate, and aromatic phosphates are preferred since they provide enhanced laser engraving sensitivity of the elastomeric layer over the other mentioned additives. That is, the preferred additives absorb infrared radiation to such an extent that given the same laser power, the elastomeric material is removed faster during engraving than an elastomeric layer containing other filler. The additive can have particle sizes up to a few micrometers, but preferably is less than 1 micrometer. The additive is present in the elastomeric composition in 1 to 20%, preferably 5 to 20%, and most preferably 10 to 20%, by weight of the elastomeric composition. Other additives may be included in the elastomeric composition provided that the sensitivity is matched to the wavelength of laser radiation used for engraving.

The elastomeric composition can optionally contain a second filler, different from the additive, to further enhance desired properties for the elastomeric layer. A suitable second filler includes carbon black, graphite, titanium dioxide, calcium carbonate, barium sulfate, aluminum, and alumina. The second filler can have particle sizes upto a few micrometers, but preferably is less than 1 micrometer. For carbon black as the filler, the particle size is usually between 200 and 500 Angstroms in diameter. The elastomeric composition can contain other components depending on the final properties desired. Such components include sensitizers, plasticizers, rheology modifiers, thermal polymerization inhibitors, colorants, antioxidants, and antiozonants.

The thickness of the reinforced elastomeric layer can vary over a wide range depending upon the type of printing element desired. The photopolymerizable layer can be from about 17 to 285 mils (0.04 to 0.72 cm) in thickness or greater. It is also contemplated that the flexographic printing element can include one or more reinforced elastomeric layers of the same or different composition than an adjacent elastomeric layer.

The support can be any flexible material which is conventionally used with photosensitive elements used to prepare flexographic printing plates. Examples of suitable support materials include polymeric films such as those formed by addition polymers and linear condensation polymers, transparent foams and fabrics such as fiberglass, and metals such as aluminum and nickel. A preferred support is a polyester film; particularly preferred is polyethylene terephthlate. The support typically has a thickness from 2 to 10 mils (0.0051 to 0.025 cm), with a preferred thickness of 3 to 8 mils (0.0076 to 0.020 cm). The support may be in sheet form or in cylindrical form, such as a sleeve. Flexible sleeves made of polymeric films are preferred as they typically are transparent to ultraviolet radiation and thereby accommodate backflash exposure for building a floor in the cylindrical printing element. The sleeve may be formed from single layer or multiple layers of flexible material provided that the sleeve has the above-described characteristics. Multiple layered sleeves may include an adhesive layer or tape between the layers of flexible material. A preferred multiple layered sleeve is disclosed in U.S. Pat. No. 5,301,610. The sleeve typically has a wall thickness from 10 to 80 mils (0.025 to 0.203 cm) or more. Other examples of supports suitable for use in the element are disclosed by Bass et al. in U.S. Pat. No. 3,146,709 and by Hoage et al. in U.S. Pat. No. 4,903,597.

An outer surface of the support may optionally bear a subbing layer of an adhesive material or primer to facilitate the adherence of the photopolymerizable layer to the sleeve. In addition, the outer surface of the sleeve may be flame-treated or electron-treated, e.g., corona treated. The treatment or primer layer is particularly useful when the support is formed of a polymeric film.

A coversheet can optionally be used to prevent contamination or damage to the surface to be laser engraved. The optional coversheet is removed prior to laser engraving. Suitable for use as the coversheet are a thin film of polyester, polycarbonate, fluoropolymers, polystyrene, polyethylene, polypropylene, or other strippable materials. Preferred as a coversheet is polyester. The coversheet can also be subbed with a release layer.

The elastomeric composition can be prepared by employing a variety of techniques which are well known in the art. One method which can be used is to mix the components (that is, binder, monomer, initiator, additive, and other ingredients) in an extruder and then extrude the mixture as a hot melt onto a support. It is preferred that the extruder be used to perform the functions of melting, mixing, deaerating, and filtering the composition. To achieve uniform thickness, the extrusion step can be advantageously coupled with a calendering step in which the hot mixture is calendered between two flat sheets or between one flat sheet and a release roll. Alternately, the material can be extruded/calendered onto a temporary support and later laminated to the desired final support. The elements can also be prepared by compounding the components in a suitable mixing device and then pressing the material into the desired shape in a suitable mold. The material is generally pressed between the support and a coversheet. The molding step can involve pressure and/or heat.

The elastomeric composition is primarily reinforced by the inclusion of the additive. The elastomeric composition is also reinforced photochemically by overall exposure to actinic radiation to effect photohardening in depth prior to laser engraving. The layer of elastomeric composition can be photochermically reinforced during the manufacture of the element or during end-use as part of the formation of the element into a printing plate. The radiation source to effect photohardening of the elastomeric layer should be chosen so that the wavelength emitted matches the sensitive range for the bleachable photoinitator. This ultraviolet radiation source should furnish an effective amount of this radiation. In addition to sunlight, suitable high energy radiation sources include carbon arcs, mercury-vapor arcs, fluorescent tubes, and sub lamps are suitable. Lasers can be used if the intensity is sufficient only to initiate photohardening, and not to ablate material. The exposure time will vary depending upon the intensity and the spectral energy distribution of the radiation, its distance from the elastomeric composition, and the nature and amount of the elastomeric composition. A removable coversheet can be present during the exposure step provided that it is removed after exposure and prior to laser engraving.

In the process of using the flexographic printing element, after photohardening the elastomeric element, the printing element is engraved with laser radiation. Laser engraving involves the absorption of laser radiation, localized heating and removal of material in three dimensions. The laser engraving process of the invention does not involve the use of a mask or stencil. This is because the laser impinges the reinforced elastomeric layer to be engraved at or near its focus spot. Thus the smallest feature that can be engraved is dictated by the laser beam itself. The laser beam and the material to be engraved are in constant motion with respect to each other, so that each minute area of the plate (pixel) is individually addressed by the laser. The image information is fed into this type of system directly from the computer as digital data, rather than via a stencil. Any pattern of a single image or multiple images of the same or different images may be engraved.

Factors to be considered when laser engraving include, but are not limited to, deposition of energy into the depth of the element, thermal dissipation, melting, vaprization, thermally-induced chemical reactions such as oxidation, presence of air-borne material over the surface of the element being engraved, and mechanical ejection of material from the element being engraved. Investigative efforts with respect to engraving of metals and ceramic materials with a focused laser beam have demonstrated that engraving efficiency (the volume of material removed per unit of laser energy) and precision are strongly intertwined with the characteristics of the material to be engraved and the conditions under which laser engraving will occur. Similar complexities come into play when engraving elastomeric materials even though such materials are quite different from metals and ceramic materials.

Laser engravable materials usually exhibit some sort of intensity threshold, below which no material will be removed. Below the threshold it appears that laser energy deposited into the material is dissipated before the vaporization temperature of the material is reached. This threshold can be quite high for metals and ceramic materials. However, with respect to elastomeric materials it can be quite low. Above this threshold, the rate of energy input competes quite well with opposing energy loss mechanisms such as thermal dissipation. The dissipated energy near, though not in, the illuminated area may be sufficient to vaporize to material and, thus, the engraved features become wider and deeper. This effect is more pronounced with materials having low melting temperatures.

Laser engraving can be accomplished by any of various types of infrared lasers emitting infrared radiation in 9 to 12 micrometer wavelength, particularly 10.6 micrometers. The removal of material by the laser is aided by the presence of the additive sensitive to infrared radiation in the reinforced elastomeric layer which absorbs the radiation energy generated by the laser. A laser which is particularly suitable for engraving flexographic printing elements is a carbon dioxide laser which emits at 10.6 micrometer wavelength. Carbon dioxide lasers are commercially available at a reasonable cost. The carbon dioxide laser can operate in continuous-wave and/or pulse mode. Capability of operating the laser in both modes is desirable since at low or moderate radiation intensities, pulse engraving may be less efficient. Energy which might heat, even melt the material, but not vaporize it or otherwise cause it to become physically detached is lost. On the other hand, continuous wave irradiation at low or moderate intensities is accumulated in a given area while the beam scans the vicinity of that area. Thus at low intensities continuous wave mode may be preferred. Pulsed mode may be the preferred mode at high intensities because if a cloud of radiation absorbing material were formed, there would be time for it to dissipate in the time interval between pulses and, thus, it would permit a more efficient delivery of radiation to the solid surface.

Typically, the flexographic printing element is mounted onto an exterior of a rotating drum associated with the laser. The laser is focused to impinge on the element on the drum. As the drum is rotated and translated relative to the laser beam, the element is exposed to the laser beam in a spiral fashion. The laser beam is modulated with image data, resulting in a two dimensional image with relief engraved into the element, that is, a three-dimensional element. Relief depth is the difference between the thickness of the floor and the thickness of the printing layer. Alternately, the laser may move relative to the element on the drum.

The laser engravable flexographic printing elements described herein can be optionally treated to remove surface tackiness either before or after laser engraving. Suitable treatments which have been used to remove surface tackiness of styrene-diene block copolymers include treatment with bromine or chlorine solutions, and light finishing, i.e., exposure to radiation sources having a wavelength not longer than 300 nm. It should be understood that such treatment does not constitute a photochemical reinforcement of the elastomeric layer.

In addition, these elements can be subjected to post-laser engraving treatments such as overall exposure to actinic radiation. Exposure to actinic radiation is generally intended to complete the chemical hardening process. This is particularly true for the floor and sidewall surfaces which are created by laser engraving.

EXAMPLES

In the following examples, all percentages are based on weight, unless otherwise indicated.

Example 1A

The following Example 1A and Comparative Example 1B demonstrate that the use of a bleachable photoinitiator enhances the photopolymerization (and curing) rate in the presence of an additive filler.

A photopolymerizable layer as described in Table 1 was prepared. The bleachable photoinitiator was bis(2,4,6-trimethylbenzoyl)-phenylphosphine oxide, sold under the tradename IRGACURE® 819 by Ciba (Hawthorne, N.Y.) as shown in Example 1A. The ingredients were blended in about 25 ml of methylene chloride and were milled at 100° C. after allowing to mix overnight. The milled material was subsequently pressed into plates of approximately 60-mil thickness on a Carver Press, a commerically available hydraulic press. The uncured hardness of the photopolymerizable layer was approximately 36 Shore A. Upon exposure to UV light from an Olite AL83 UV light exposure unit (from OLEC Corp., Irvine, Calif.) for 1 minute, the plate photocured and attained a Shore A Hardness of approximately 60. The light intensity of the UV source used was 17.8 mW/cm2.

TABLE 1

| Ingredient | Weight Percent |
| --- | --- |
| Kraton 1102 (a thermoplastic elastomeric block copolymer of styrene-butadiene-styrene (SBS)) | 54.2 |
| Zirconium silicate (ZiSiO$_4$) | 5 |
| 1,6-hexamethylene diacrylate | 10 |
| 2-hydroxyethyl methacrylate | 0.234 |
| Photoinitiator (structure in FIG. 1A) | 0.55 |
| Polybutadiene oils[1] (1:1 mixture of Nisso PB 1000 and Huls Polyoil 130) | 29.01 |
| Thermal Inhibitor, a butylated hydroxytoluene (BHT) | 1 |
| Red Dye | 0.006 |

[1]Nisso PB 1000 from Nippon Soda, Tokyo, Japan
Huls Polyiol 130 from Creanova, Piscataway, NJ

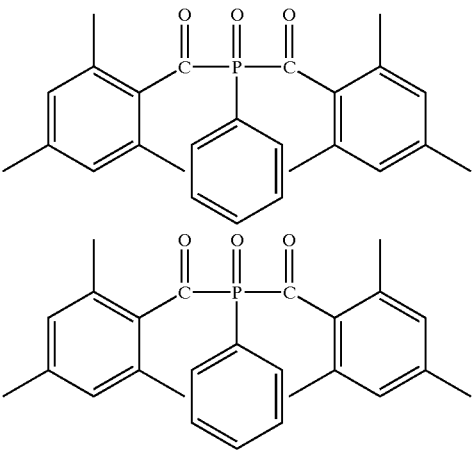

Example 1A: Structure of Bis(2,4,6-trimethylbenzoyl)-phenylphosphineoxide

Comparative Example 1B

A photopolymerizable layer was prepared the same as that described in Example 1A except that the bleachable photoinitiator was replaced with 1% 2,2-dimethoxy phenyl acetophenone (a conventional initiator, shown in Example 1B, sold under the tradename Irgacure® 651 by Ciba (Hawthorne, N.Y.)). The filler, zirconium silicate, remained in the composition. The change in the initiator concentration was adjusted by changing the oil concentration. The uncured hardness of the layer was approximately 39 Shore A. The photopolymerizable layer was exposed to UV radiation of the same wavelength and intensity as described in Example 1A. The layer attained a Shore A Hardness of approximately 58 after 7 minutes of exposure under the same UV source and using the same conditions.

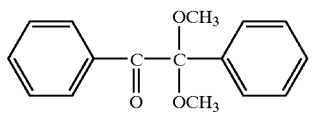

Example 1B: Structure of 2,2-dimethoxy-2-phenyl acetophenone (DMPA)

Example 2

The following example demonstrates the dependence of the rate of polymerization on the concentration of the initiator and the concentration of the additive filler.

Photopolymerizable layers of formulations similar to those described in Example 1A but with varying amounts of a phosphine oxide photoinitiator (2,4,6-trimethyl-benzoyldiphenylphosphine oxide, (sold under the tradename LUCIRIN® TPO by BASF), shown in Example 2) and varying amounts of a precipitated amorphous silica (HiSil® 915, PPG Industries, Pittsburgh, Pa.) in place of the zirconium silicate were prepared. The amounts of silica and initiator in the different formulations are shown in Table II. Changes in the additive concentration were compensated for by changing the SBS polymer concentration. Changes in the initiator concentration were compensated by changing the oil concentration. Plates of approximately 0.060 in. thickness were pressed from these formulations as described in Example 1.

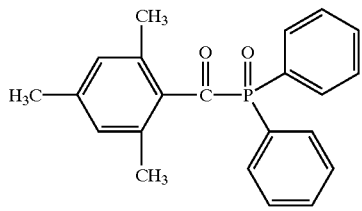

Example 2. Structure of 2,4,6-trimethyl-benzoyldiphenylphosphine oxide

Differential scanning calorimetry is widely used in the study of photopolymerization as indicated by C. E. Hoyle, "Calorimetric Analysis of Photopolymerization", *Radiation Curing Science and Technology*, S. Peter Pappas (Ed.), Chap. 3, 57–133, Plenum Press, New York, 1992. This technique works based on the principle that the rate of reaction (in this case polymerization) is directly related to the heat released when the reaction (polymerization) proceeds.

A differential scanning calorimeter with a photo accessory (from TA Instruments, New Castle, Del.) was used to study the rate of photopolymerization for each of these plates. The photopolymerizations in the differential scanning calorimeter were performed at a light intensity of approximately 5 mW/cm$^2$ UV light intensity. The rate maximum, which is representative of the curing rate of the formulation, for each of the said formulations was obtained. Table 2 shows the photopolymerization rate dependence on photoinitiator and filler concentration relative to the rate maxima. The higher the rate maximum the faster the rate of photopolymerization.

TABLE 2

| Weight percent of photoinitiator | Weight percent of additive | Rate maximum (in Watts/gram) |
|---|---|---|
| 0.1 | 1 | 0.25 |
| 0.55 | 1 | 0.38 |
| 1.0 | 1 | 0.31 |
| 0.1 | 5 | 0.21 |
| 0.55 | 5 | 0.35 |
| 1.0 | 5 | 0.18 |

Example 3A

The following example demonstrates that the presence of the filler zirconium silicate improves laser engraving sensitivity of the elastomeric printing layer.

The photopolymerizable layer described in Example 1B was photopolymerized by blanket exposure in a CYREL® 2001E exposure unit and engraved using a Kern $CO_2$ laser engraver (from Kern Engravers, Wis.). The scan speed of the laser was 5 inches per second and was focused on the surface. The engraved depth at 25 W laser power was measured to be 0.021 inch. The debris left after engraving was powdery and easily cleaned.

Comparative Example 3B

A photopolymerizable layer with a similar formulation to that used in Example 3A but without the zirconium silicate was photopolymerized and engraved under the same conditions described in Example 3A. Change in the additive filler concentration was adjusted by changing the SBS polymer concentration. The engraved depth was measured to be 0.016 inch. The debris left upon engraving was tacky and not easily cleaned.

When compared to Example 3A, the presence of zirconium silicate substantially improved the engraving sensitivity of the elastomeric composition and improved cleanability of the engraving debris.

Example 3C

A photopolymerizable layer with a similar formulation to that used in Example 3A was prepared with the exception that the zirconium silicate was replaced with 5% by weight HiSil® 915 (amorphous silica). The layer was photopolymerized and engraved under the same conditions described in Example 3A. The engraved depth was measured to be 0.019 inch. Further, the debris left upon engraving was slightly tacky and moderately easy to clean.

Example 4A

The following example demonstrates that the presence of an additive with P—O functionality in non-particulate form, that is, in liquid form, increases laser engraving sensitivity of an elastomeric layer.

A layer containing the same thermoplastic elastomer used in Example 3C but with 20 weight percent tricresyl phosphate was prepared. Upon engraving this layer using a $CO_2$ laser engraver (from ULS, Tucson, Ariz.) at 50 W laser power and a scan speed of 24 inches per second, the engraved depth was measured to be 0.024 inches. The debris was a slightly viscous liquid that was easy to clean.

A Control sample was prepared which consisted of a layer of a thermoplastic elastomer, block copolymer of styrene-butadiene-styrene (Kraton 1102). This layer was engraved using the same conditions as described above (a CO$_2$ laser engraver (from ULS, Tucson, Ariz.) at 50 W laser power and a scan speed of 24 inches per second). The laser was focused on the surface of the layer. The engraved depth was measured to be 0.022 inches. The debris was a tacky powder that was not easy to clean.

Example 5A

The following example demonstrates the efficiency of a phosphine oxide based bleachable photoinitiator to photopolymerize the elastomeric layer.

A photopolymerizable layer of the formulation provided in Table 3 was prepared by blending all ingredients in approximately 30 ml of tetrahydrofuran (THF) and casting into a pan to evaporate the solvent under a hood. Subsequently, the material was placed in a vacuum oven overnight to drive out any remaining solvent. This material was then pressed in a hot press at approximately 100° C. into a photopolymerizable layer of approximately 60-mil thickness. The uncured hardness of the layer was 44 Shore A. This layer was photopolymerized using an OLITE AL83 UV Exposure Unit (OLEC) for approximately 30 seconds. The UV light intensity of the source was 15.5 mW/cm$^2$. The Shore A Hardness of the photocured layer was found to be 70.

TABLE 3

| Ingredient | Weight Percent |
| --- | --- |
| Kraton 1102 | 59 |
| 1,6-hexamethylene diacrylate | 10 |
| Photoinitiator (structure in FIG. 1A) | 0.5 |
| Nisso oil | 15 |
| Huls Polyoil | 15 |
| Thermal Inhibitor, BHT | 0.5 |

Comparative Example 5B

A photopolymerizable layer with the same formulation as the one discussed in Example 5A, with the exception that 1.0% DMPA (see FIG. 1B) replaced the 0.5% Bis(2,4,6-trimethylbenzoyl)-phenylphosphine oxide and 14.5% Nisso oil instead of the 15%, was prepared. The procedure was the same as that used in Example 5A. The uncured hardness of the layer was 44 Shore A. This layer was then photopolymerized using the same light source at the same conditions. Exposure of 30 seconds resulted in a Shore A Hardness of 57 and an exposure time of 300 seconds resulted in a Hardness of 68.

What is claimed is:

1. A laser engravable flexographic printing element comprising:
   (a) a support; and
   (b) at least one laser engravable reinforced elastomeric layer of an elastomeric composition comprising an elastomeric binder, at least one monomer, a photoinitiator system that decreases in ultraviolet absorbance as polymerization proceeds, and at least one additive containing Si—O or P—O functionality which absorbs infrared radiation.

2. The element of claim 1 wherein the photoinitiator is a bleachable photoinitiator of an acylphosphine oxide.

3. The element of claim 2 wherein the bleachable photoinitiator is selected from the group consisting of 2,4,6-trimethyl-benzoyl-diphenylphosphine oxide; bis(2,4,6-trimethylbenzoyl)-2,4-diisobutoxyphenylphosphine oxide; bis(2,4,6-trimethylbenzoyl)-phenylphosphine oxide; bis(2,4,6-trimethylbenzoyl)-2,4-dioctyloxyphenyl phosphine oxide; bis(2,4,6-trimethylbenzoyl)-2,4-diisopropoxyphenylphosphine oxide; bis(2,4,6-trimethylbenzoyl)-2,4-dihexyloxyphenylphosphine oxide; bis(2,4,6-trimethylbenzoyl)-2,4-di-sec-butoxyphenylphosphine oxide; bis(2,4,6-trimethylbenzoyl)-2-methyl-4-methoxyphenylphosphine oxide; bis(2,4,6-trimethylbenzoyl)-2-propoxy-4-methylphenylphosphine oxide; bis(2,4,6-trimethylbenzoyl)-2,4-diisopentyloxyphenylphosphine oxide; bis(2,4,6-trimethylbenzoyl)-2,6-dimethyl-4-butoxyphenylphosphine oxide; bis(2,6-dimethyoxybenzoyl)-2,4-dioctyloxyphenylphosphine oxide; bis(2,6-dimethyoxybenzoyl)-2,4-diisobutoxyphenylphosphine oxide; bis(2,6-dimethyoxybenzoyl)-2-methyl-4-methoxyphenylphosphine oxide; and bis(2,6-diethyoxybenzoyl)-2-propoxy-4-methylphenylphosphine oxide.

4. The element of claim 2 wherein the bleachable photoinitiator is selected from the group consisiting of bis(2,4,6-trimethylbenzoyl)-phenylphosphine oxide and 2,4,6-trimethyl-benzoyldiphenylphosphine oxide.

5. The element of claim 1 wherein the additive containing the Si—O functionality is selected from the group consisting of silica, calcium silicate, mica, clays, talc, zirconium silicate.

6. The element of claim 1 wherein the additive containing the P—O functionality is selected from the group consisting of aromatic phosphates, aromatic phosphites and aromatic phosphonates.

7. The element of claim 1 wherein the binder is present from 40 to 75% by weight of the elastomeric composition.

8. The element of claim 1 wherein the at least one additive is present from 1 to 20% by weight based upon the weight of the elastomeric composition and is selected from the group consisting of silicates, aromatic phosphates, aromatic phosphites and aromatic phosphonates.

9. The element of claim 1 wherein the at least one additive absorbs infrared radiation at 9 to 12 micrometers.

10. A method for forming a flexographic printing plate comprising:
    providing a photosensitive printing element comprising:
      (a) a support; and
      (b) at least one laser engravable reinforced elastomeric layer of an elastomeric composition comprising an elastomeric binder, at least one monomer, a photoinitiator system that decreases in UV absorbance as polymerization proceeds, and an additive containing Si—O or P—O functionality which absorbs infrared radiation at 9 to 12 micrometers;
    exposing the photosensitive printing element overall to ultraviolet radiation to effect photohardening in depth; and
    exposing imagewise the photohardened element with infrared laser radiation between 9 and 12 micrometers to engrave the elastomeric layer.

* * * * *

UNITED STATES PATENT AND TRADEMARK OFFICE
CERTIFICATE OF CORRECTION

PATENT NO. : 6,737,216 B2
DATED : May 18, 2004
INVENTOR(S) : Anandkumar Ramakrishnan Kannurpatti and Howard E. Simmons, III It is certified that error appears in the above-identified patent and that said Letters Patent is hereby corrected as shown below:

<u>Column 10,</u>
Lines 35 to 45, delete

" 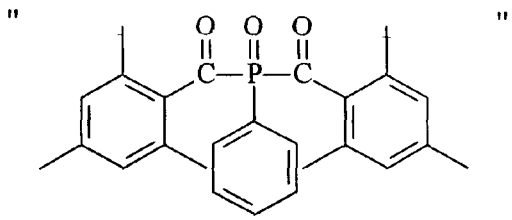 ".

(structure repeated)

Signed and Sealed this

Twenty-first Day of September, 2004

JON W. DUDAS
*Director of the United States Patent and Trademark Office*